(12) United States Patent
Takahashi et al.

(10) Patent No.: US 11,309,859 B2
(45) Date of Patent: Apr. 19, 2022

(54) NOISE FILTER

(71) Applicant: KABUSHIKI KAISHA TOYOTA CHUO KENKYUSHO, Nagakute (JP)

(72) Inventors: Atsuhiro Takahashi, Nagakute (JP); Katsuya Nomura, Nagakute (JP); Takashi Kojima, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 0 days.

(21) Appl. No.: 17/257,378

(22) PCT Filed: Jul. 5, 2019

(86) PCT No.: PCT/JP2019/026909
§ 371 (c)(1),
(2) Date: Dec. 31, 2020

(87) PCT Pub. No.: WO2020/017368
PCT Pub. Date: Jan. 23, 2020

(65) Prior Publication Data
US 2021/0273624 A1 Sep. 2, 2021

(30) Foreign Application Priority Data

Jul. 17, 2018 (JP) .............................. JP2018-134367
Jun. 25, 2019 (JP) .............................. JP2019-117840

(51) Int. Cl.
*H03H 7/06* (2006.01)
*H03H 7/01* (2006.01)
*H02M 1/44* (2007.01)

(52) U.S. Cl.
CPC ............ *H03H 7/06* (2013.01); *H03H 7/0115* (2013.01); *H02M 1/44* (2013.01)

(58) Field of Classification Search
CPC ...... H03H 7/0115; H03H 7/42; H03H 1/0007; H03H 7/06
(Continued)

(56) References Cited

U.S. PATENT DOCUMENTS 6,476,689 B1    11/2002 Uchida et al.
6,937,115 B2    8/2005 Perreault et al.
(Continued)

FOREIGN PATENT DOCUMENTS

JP    H09-214276 A    8/1997
JP    2001-160728 A   6/2001
(Continued)

OTHER PUBLICATIONS

JP 2016031965A, Machine translation (Year: 2016).*
(Continued)

*Primary Examiner* — Rakesh B Patel
(74) *Attorney, Agent, or Firm* — Oliff PLC

(57) ABSTRACT

A noise filter may include: a first conductive line extending between an input and an output terminal portion, wherein the first conductive line includes an input-side conductive line extending between the input terminal portion and a branch portion, and an output-side conductive line extending between the output terminal portion and the branch portion; a second conductive line connected to the branch portion of the first conductive line, wherein a capacitor is on the second conductive line; and a magnetic body surrounding at least a part of a circumference of at least a part of the first conductive line, wherein the magnetic body is configured to magnetically couple the input-side and the output-side conductive lines such that at least an equivalent series inductance of the capacitor and a parasitic inductance of the
(Continued)

second conductive line are reduced by a mutual inductance between the input-side conductive line and the output-side conductive line.

12 Claims, 13 Drawing Sheets

(58) Field of Classification Search
USPC .............................. 333/175, 181, 185, 172
See application file for complete search history.

(56) References Cited

U.S. PATENT DOCUMENTS

| | | |
|---|---|---|
| 2007/0241838 A1 | 10/2007 | Suzuki |
| 2016/0285360 A1 | 9/2016 | Elshaer et al. |
| 2017/0012593 A1 | 1/2017 | Tanimizu et al. |
| 2019/0341902 A1 | 11/2019 | Yoneda et al. |

FOREIGN PATENT DOCUMENTS

| | | |
|---|---|---|
| JP | 2007-067941 A | 3/2007 |
| JP | 2016-031965 A | 3/2016 |
| WO | 2005/101626 A1 | 10/2005 |
| WO | 2016/039414 A1 | 3/2016 |
| WO | 2018/025342 A1 | 2/2018 |

OTHER PUBLICATIONS

Sep. 17, 2019 International Search Report issued in International Patent Application No. PCT/JP2019/026909.

Sep. 17, 2019 Written Opinion issued in International Patent Application No. PCT/JP2019/026909.

Aug. 6, 2021 Search Report issued in European Patent Application No. 19838824.1.

* cited by examiner

NOISE FILTER

CROSS-REFERENCE TO RELATED APPLICATION

The present application is a related application of Japanese Patent Application No. 2018-134367 filed on Jul. 17, 2018 and Japanese Patent Application No. 2019-117840 filed on Jun. 25, 2019 and claims priority to these Japanese applications, contents of which are incorporated to the present description by reference.

TECHNICAL FIELD

The art disclosed herein relates to a noise filter.

BACKGROUND ART

Noise filters have been developed to reduce electromagnetic noise that superimposes on conductive lines. Many of this type of noise filters are provided with a capacitor to allow electromagnetic noise to reach GND by bypassing a conductive line. However, the capacitor has a parasitic inductance called equivalent series inductance (ESL), and a line to which the capacitor is connected also has a parasitic inductance. Due to the influence of these parasitic inductances, such noise filters are known to be incapable of exhibiting satisfactory filtering performance to the electromagnetic noise in high-frequency band.

U.S. Pat. No. 6,937,115 describes a noise filter that uses magnetic coupling of a pair of inductors connected in series to a conductive line. In the noise filter described in U.S. Pat. No. 6,937,115, its filtering performance is improved by reducing the equivalent series inductance of a capacitor by a mutual inductance between the pair of inductors.

SUMMARY OF INVENTION

Technical Problem

In the art described in U.S. Pat. No. 6,937,115, a conductive line formed in a specific pattern is used to configure the magnetically coupled pair of inductors into a conductive line. However, depending on the specific pattern of the conductive line, an area of the noise filter may become large. Further, depending on the specific pattern of the conductive line, the conductive line has a narrow width, which results in a decreased heat radiation from the conductive line and an increased parasitic resistance. Due to this, heat generation accompanying energy loss in the noise filter may not be reduced. Since such problems need to be taken into consideration, art using a conductive line formed in a specific pattern has extremely low degree of freedom in design. Thus, art using a conductive line formed in a specific pattern can be said as having low versatility. The disclosure herein aims to provide a highly versatile noise filter configured to reduce at least an equivalent series inductance of a capacitor and a parasitic inductance of a line to which the capacitor is connected.

Solution to Technical Problem

In an embodiment, a noise filter disclosed herein may comprise a first conductive line, a second conductive line, and a first magnetic body. The first conductive line may extend between an input terminal portion and an output terminal portion, and may include an input-side conductive line extending between the input terminal portion and a branch portion and an output-side conductive line extending between the output terminal portion and the branch portion. The second conductive line may be connected to the branch portion of the first conductive line, and a capacitor may be on the second conductive line. The first magnetic body may surround at least a part of a circumference of at least a part of the first conductive line. The first magnetic body may be configured to magnetically couple the input-side conductive line to the output-side conductive line such that at least an equivalent series inductance of the capacitor and a parasitic inductance of the second conductive line are reduced by a mutual inductance between the input-side conductive line and the output-side conductive line. In the noise filter of this embodiment, at least the equivalent series inductance of the capacitor and the parasitic inductance of the second conductive line can be reduced by the first magnetic body being arranged to surround the circumference of the first conductive line. In the noise filter of this embodiment, there is no need to form the first conductive line in a specific pattern. Therefore, this art of arranging the first magnetic body to the first conductive line can be adapted to various types of conductive lines and has high versatility.

In the noise filter of the above embodiment, the first magnetic body may comprise a first magnetic body portion, a second magnetic body portion, and a third magnetic body portion. The first magnetic body portion may surround at least a part of a circumference of a first portion that is at least a part of the input-side conductive line. The second magnetic body portion may surround at least a part of a circumference of a second portion that is at least a part of the output-side conductive line. The third magnetic body portion may extend between the first magnetic body portion and the second magnetic body portion. The third magnetic body portion may be arranged to be in direct contact with the first magnetic body portion and the second magnetic body portion or may be arranged separate therefrom. Here, the terms "the first magnetic body portion", "the second magnetic body portion", and "the third magnetic body portion" do not necessarily mean that each of them is configured as one separate member. For example, the first, second, and third magnetic body portions may be configured integrally. Further, each of the first, second, and third magnetic body portions may be configured of multiple members. Alternatively, one member may configure a part of each of the plurality of magnetic body portions. That is, the first magnetic body may be embodied in various manners so long as it has portions that function as the first magnetic body portion, the second magnetic body portion, and the third magnetic body portion.

In the noise filter of the above embodiment, the first portion of the input-side conductive line and the second portion of the output-side conductive line may extend to be linearly aligned. In this case, the first magnetic body may be arranged to cross the first conductive line above the branch portion and surround the at least a part of the circumference of the first portion and the at least a part of the circumference of the second portion. For example, this first magnetic body may be configured of a combination of a first lower divided portion, a second lower divided portion, a first upper divided portion, and a second upper divided portion. In this case, the first lower divided portion may extend below the first portion of the input-side conductive line to cross the input-side conductive line. The second lower divided portion may extend below the second portion of the output-side conductive line to cross the output-side conductive line. The first upper divided portion may cross the first conductive line above the branch portion and extend between one end of the first lower divided portion and one end of the second lower divided portion. The second upper divided portion may cross the first conductive line above the branch portion and extend between another end of the first lower divided portion and another end of the second lower divided portion. The first upper divided portion and the second upper divided portion may be skew above the branch portion. The terms "below" and "above" herein are used merely to identify relative positional relationships with respect to the first conductive line for the sake of convenience, and do not identify spatial relationships along an up-down direction. The first and second lower divided portions and the first and second upper divided portions configured as above can easily be arranged with respect to the first conductive line. Further, as needed, a gap may be provided between at least one end of the first lower divided portion and the upper divided portion(s). Similarly, a gap may be provided between at least one end of the second lower divided portion and the upper divided portion(s). With such gap(s), the mutual inductance between the input-side conductive line and the output-side conductive line can be adjusted by adjusting gap distance(s).

In the noise filter of the above embodiment, the first portion of the input-side conductive line and the second portion of the output-side conductive line may face each other with an interval of a predetermined distance therebetween and extend substantially parallel to each other. In this case, the first magnetic body may be arranged to loop outside the first portion and the second portion. For example, in this noise filter, the first magnetic body may be configured of a combination of a first divided portion and a second divided portion. In this case, a gap may be provided between at least one end of the first divided portion and at least one end of the second divided portion. By adjusting gap distance (s) and/or the like, the mutual inductance between the input-side conductive line and the output-side conductive line can be adjusted. Further, each of the first divided portion and the second divided portion may have a U-shape. The first and second divided portions configured as above can easily be arranged with respect to the first conductive line.

In the noise filter of the above embodiment, the first magnetic body may be arranged to spiral around the circumference of the first conductive line. The magnetic coupling between the input-side conductive line and the output-side conductive line can be adjusted by adjusting a length of the first magnetic body, a pitch of the spiral, and/or the like.

In the noise filter of the above embodiment, the first conductive line may be configured of a flat plate-shaped bus bar. Even with the first conductive line configured of the flat plate-shaped bus bar, at least the equivalent series inductance of the capacitor and the parasitic inductance of the second conductive line can be reduced by arranging the first magnetic body to surround the circumference of such a bus bar.

The noise filter of the above embodiment may comprise a second magnetic body surrounding at least a part of a circumference of at least a part of the second conductive line. Due to the second magnetic body, an inductor is connected in series to the capacitor, and the inductance of the second conductive line is thereby increased. To cancel the increase in the inductance of the second conductive line, the mutual inductance between the input-side conductive line and the output-side conductive line can be significantly adjusted by the first magnetic body. As a result, in this noise filter, the inductance of each of the input-side conductive line and the output-side conductive line is increased, and thus the filtering performance can be improved.

In the noise filter of the above embodiment, the first magnetic body and the second magnetic body may be constituted of a same magnetic material. With this noise filter, the filtering performance can be significantly improved by a more precise design.

The noise filter of the above embodiment may further comprise a resistor disposed on the second conductive line and connected to the capacitor in series. With this noise filter, the filtering performance can significantly be improved by a more precise design.

DESCRIPTION OF EMBODIMENTS

Figure 1:
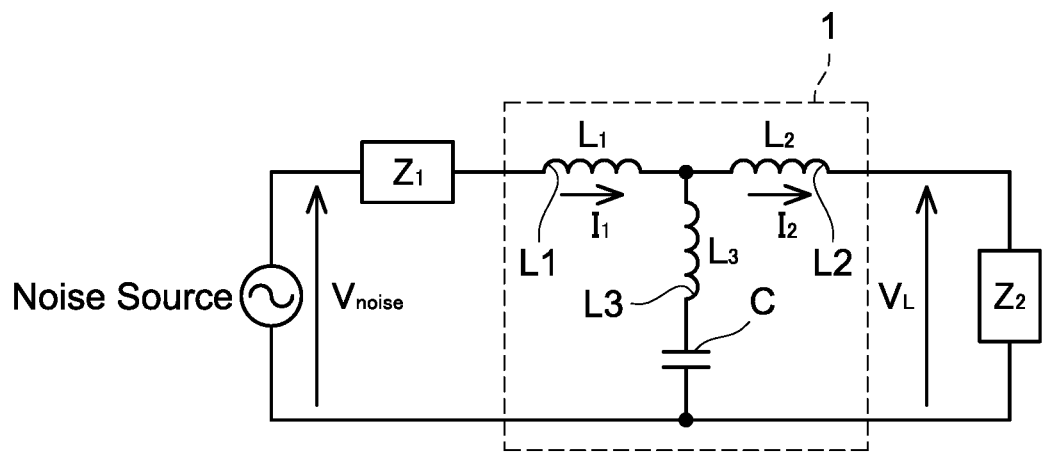
FIG. 1 is a diagram for explaining a noise transmission characteristic of a T-type noise filter with an LCL configuration.

Prior to explanation of a noise filter disclosed in the description of the present application, a noise transmission characteristic of a T-type noise filter 1 with an LCL configuration will be described with reference to FIG. 1. The noise filter 1 is provided with a pair of inductors L1, L2 connected in series with a power conductive line and a capacitor C connected between the power conductive line and a reference conductive line. An inductance of the inductor L1 is $L_1$ and an inductance of the inductor L2 is $L_2$. These inductors L1, L2 may be parasitic inductors of the power conductive line. One end of the capacitor C is connected to a branch portion between the pair of inductors L1, L2 and another end thereof is connected to the reference conductive line. An inductance $L_3$ of an inductor L3 is a sum of an equivalent series inductance (ESL) of the capacitor C and a parasitic inductance of a branch line to which the capacitor C is connected. $Z_1$ is an internal impedance of a noise source and $Z_2$ is an impedance of a load circuit. In this noise filter 1, the inductor L1 and the inductor L2 are magnetically coupled. Assuming that currents $I_1$ and $I_2$ are flowing respectively through the inductors L1 and L2 in the direction indicated in the drawing, a positive mutual inductance M is generated between these inductors L1 and L2. A noise voltage $V_L$ applied to the load circuit is expressed in the following formula, where $V_{noise}$ is a noise voltage.

$$V_L = \frac{(Z_{L3}+Z_C)Z_2}{(Z_1+Z_2+Z_{L1}+Z_{L2})Z_{L3}+(Z_1+Z_{L1}+Z_C)Z_{L2}+(Z_2+Z_C)Z_{L1}+(Z_1+Z_2)Z_C+Z_1Z_2} V_{noise}$$ [Formula 1]

$Z_{L1}$: impedance ($j\omega(L_1+M)$) of the inductor L1
$Z_{L2}$: impedance ($j\omega(L_2+M)$) of the inductor L2
$Z_{L3}$: impedance ($j\omega(L_3-M)$) being the sum of the equivalent series inductor of the capacitor C and the parasitic inductor of the branch line to which the capacitor C is connected
$Z_C$: impedance ($1/j\omega C$) of the capacitor C
$\omega$: angular frequency ($2\pi f$)

As indicated by the above formula 1, it is important to reduce the numerator $Z_{L3}+Z_C$ in order to reduce the noise voltage $V_L$ applied to the load circuit.

An amplitude of the voltage $V_L$ is expressed in an absolute value. Assuming that the numerator of the absolute value of the above formula 1 is $V_{Lnum}$, it can be expressed by the following formula.

$$V_{Lnum} = \left|\left\{\omega(L_3-M)-\frac{1}{\omega C}\right\}Z_2\right|V_{noise}$$ [Formula 2]

According to the above formula 2, it can be understood that the filtering performance can be maximized when the mutual inductance M is set such that $\{\omega(L_3-M)-1/\omega C\}$ becomes 0. However, such a condition is realized only at a certain frequency. Therefore, a noise filter circuit configured to reduce noise in a wide frequency range is not set to such a condition.

Here, the mutual inductance M between the inductor L1 and the inductor L2 can be expressed by the following formula using a coupling coefficient k.

$$M=k\sqrt{L_1 L_2}$$ [Formula 3]

The coupling coefficient k is a value indicating a degree of magnetic coupling. In the structure disclosed herein, k satisfies $0 \leq k \leq 1$. As shown in the above formulas 2 and 3, if values of k, L1, and L2 are adjusted to make the inductance $L_3$ and the mutual inductance M equal to each other, only a product of the impedance of the capacitor C and the impedance of the load circuit remains as the numerator of the above formula 1. Since the angular frequency $\omega$ increases with an increase in frequency, making the inductance $L_3$ and the mutual inductance M equal to each other improves the filtering performance for electromagnetic noise in high-frequency band.

Figure 2:
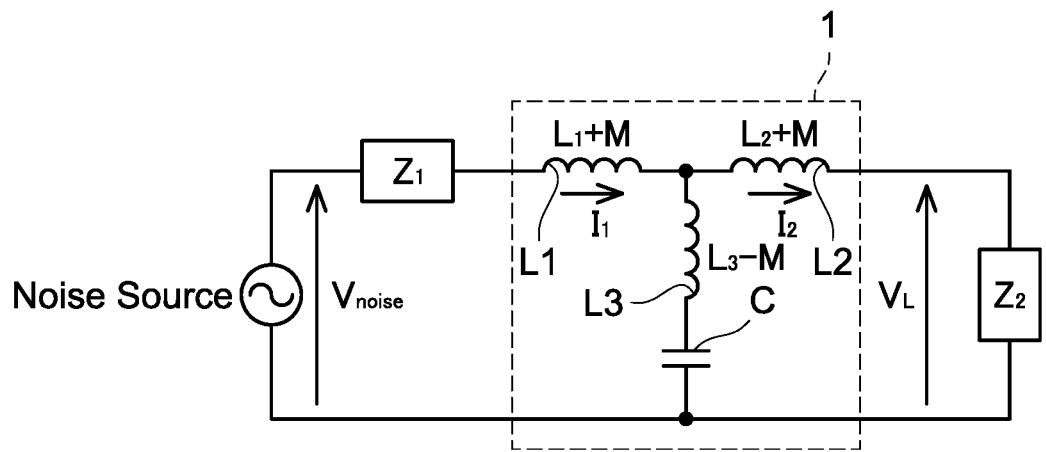
FIG. 2 is a diagram for explaining the noise transmission characteristic of the T-type noise filter with the LCL configuration.

That is, as shown in FIG. 2, if at least the inductance $L_3$ is reduced by the mutual inductance M generated between the inductor L1 and the inductor L2 by magnetically coupling the inductor L1 and the inductor L2, the filtering performance for electromagnetic noise in high-frequency band can be improved. By using this phenomenon, the art disclosed herein improves the filtering performance for electromagnetic noise in high-frequency band.

Hereinbelow, a noise filter to which the art disclosed herein is applied will be described. In the drawings referenced hereinbelow, constituent elements that have substantially common functions will be given a common reference sign, and descriptions thereof may be omitted.

Figure 3A:
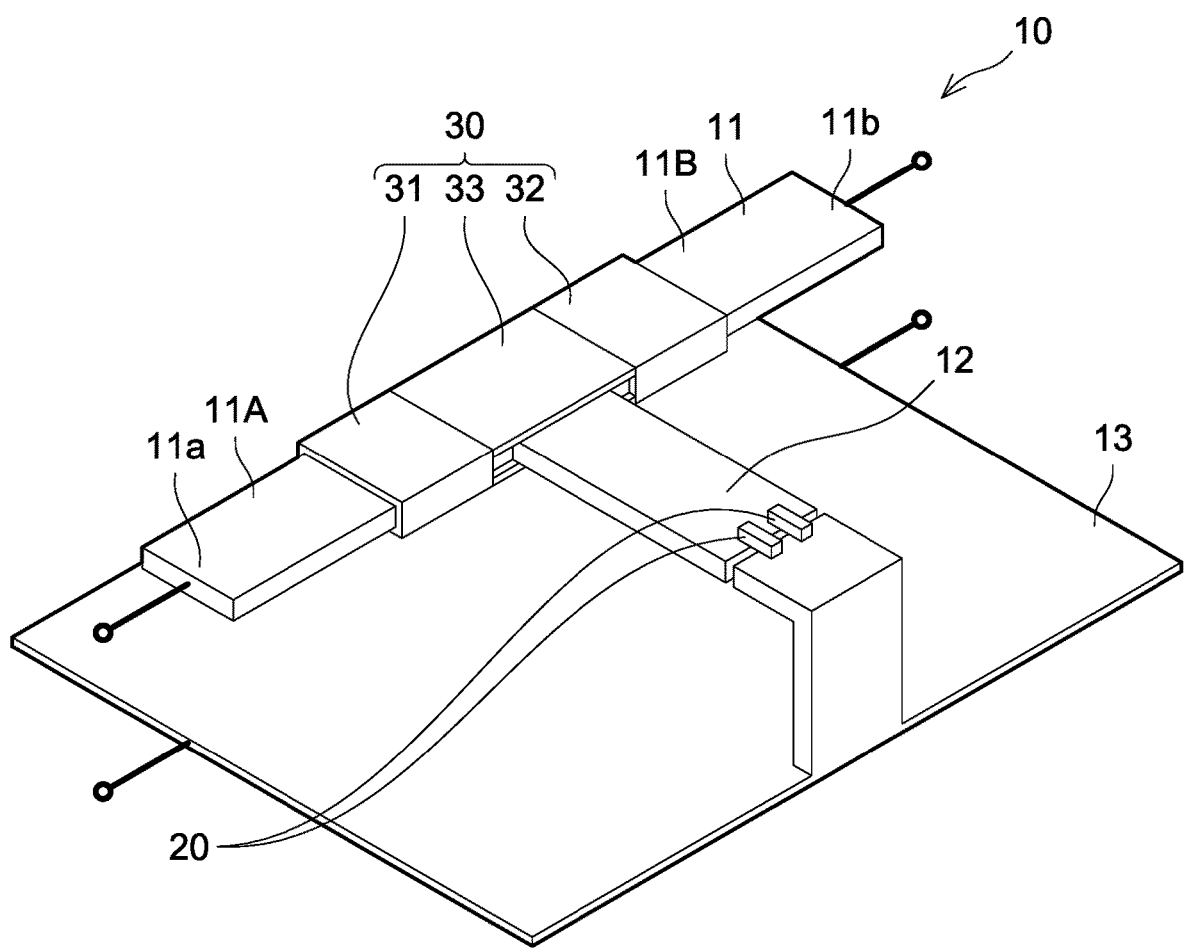
FIG. 3A schematically shows a perspective view of a noise filter of a present embodiment.
Figure 3B:
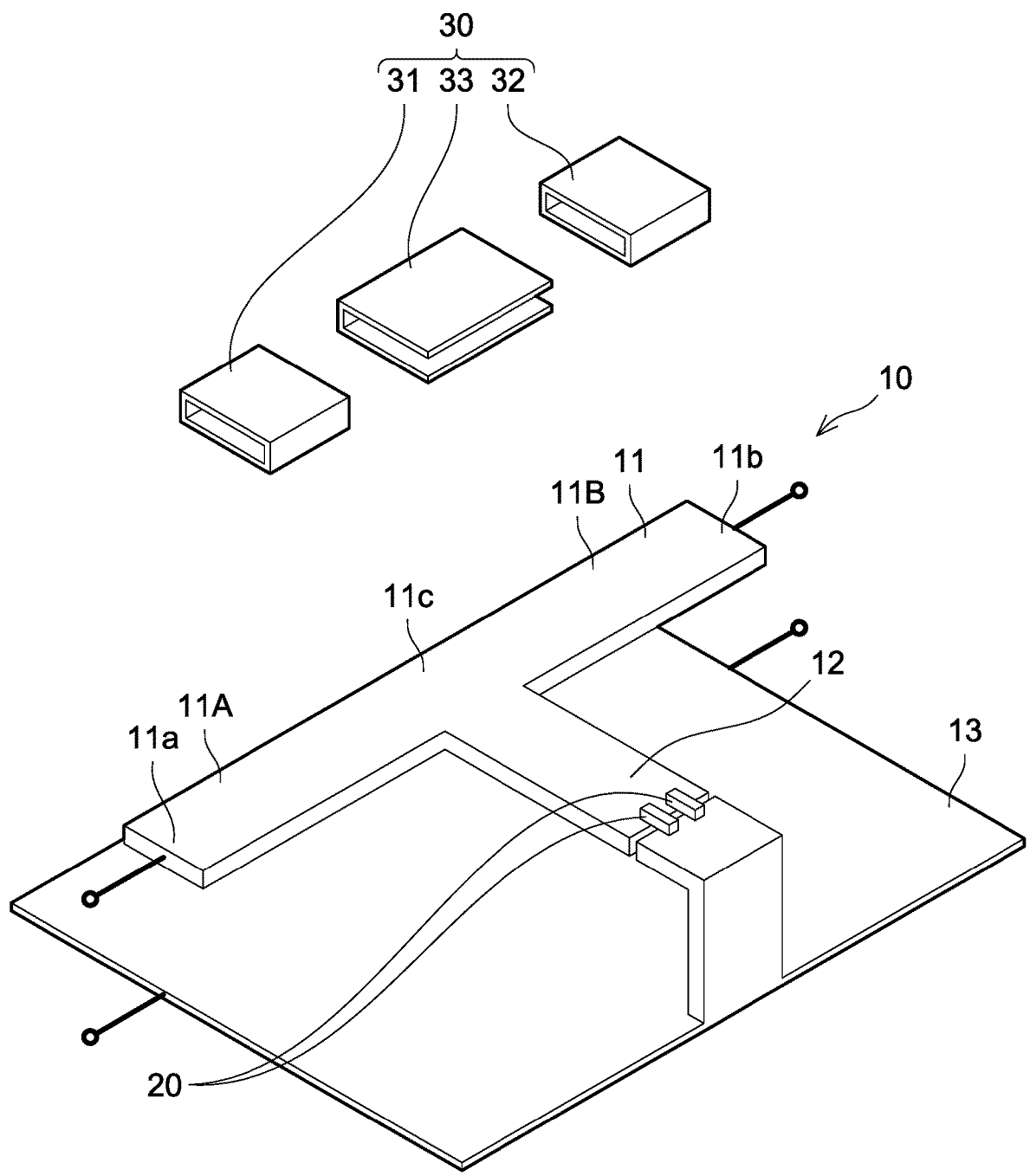
FIG. 3B schematically shows an exploded perspective view of the noise filter of the present embodiment.

FIG. 3A shows a perspective view of a noise filter 10, and FIG. 3B shows an exploded perspective view thereof. The noise filter 10 includes a first conductive line 11 that linearly extends between an input terminal portion 11a and an output terminal portion 11b, a second conductive line 12 that is connected to a branch portion 11c of the first conductive line 11 and has a capacitor 20 disposed thereon, and a first magnetic body 30. The first magnetic body 30 is configured of a magnetic sheet in which ferrite powder, which is a magnetic material, is kneaded in resin, and includes a first magnetic body portion 31, a second magnetic body portion 32, and a third magnetic body portion 33. The first magnetic body 30 may be a magnetic plate obtained by shaping ferrite and/or the like resulting from sintering of a material such as Mn—Zn or Ni—Zn.

The first conductive line 11 is configured of a metal bus bar in a flat plate shape. The input terminal portion 11a is connected to a power converter such as a converter or an inverter that can be a noise source, and the output terminal portion 11b is connected to a load. A portion of the first conductive line 11 that is located between the input terminal portion 11a and the branch portion 11c is termed an input-side conductive line 11A. A portion of the first conductive line 11 that is located between the output terminal portion 11b and the branch portion 11c is termed an output-side conductive line 11B. The input-side conductive line 11A and the output-side conductive line 11B are arranged to be linearly aligned with each other. Instead of this example, the first conductive line 11 may be a metal pattern on a circuit board.

The second conductive line 12 is configured of a metal bus bar in a flat plate shape. One end of the second conductive line 12 is connected to the branch portion 11c of the first conductive line 11 and another end thereof is connected to a ground plate 13. The second conductive line 12 perpendicularly intersects the first conductive line 11 and extends from a side surface of the first conductive line 11. The capacitor 20 is on the second conductive line 12. In this example, the capacitor 20 is configured as dual-parallel chip capacitors.

As above, the noise filter 10 is a T-type noise filter with an LCL configuration that is configured of a parasitic inductance of the input-side conductive line 11A, the capacitor C arranged on the second conductive line 12, and a parasitic inductance of the output-side conductive line 11B. The art disclosed herein is not limited to this example, and may be applied to other types of noise filters.

The first magnetic body portion 31 is arranged to cover a circumference of a part of the input-side conductive line 11A of the first conductive line 11. In this example, the first magnetic body portion 31 circumferentially covers the entire circumference of the part of the input-side conductive line 11A, however, it may be arranged to circumferentially cover a part of the circumference. Further, the first magnetic body portion 31 is not limited to this example, and may employ various configurations. For example, the first magnetic body portion 31 may be a ring-shaped (annular, polygonal, etc.) ferrite core, or may be a magnetic sheet that spirals around the first conductive line 11 as described later. The inductance of the input-side conductive line 11A is adjusted by the first magnetic body portion 31 being arranged. In the disclosure herein, the part of the input-side conductive line 11A of the first conductive line 11 surrounded by the first magnetic body portion 31 is termed "first portion".

The second magnetic body portion 32 is arranged to cover a circumference of a part of the output-side conductive line 11B of the first conductive line 11. In this example, the second magnetic body portion 32 circumferentially covers the entire circumference of the part of the output-side conductive line 11B, however, it may be arranged to circumferentially cover a part of the circumference. Further, the second magnetic body portion 32 is not limited to this example, and may employ various configurations. For example, the second magnetic body portion 32 may be a ring-shaped (annular, polygonal, etc.) ferrite core, or may be a magnetic sheet that spirals around the first conductive line 11 as described later. The inductance of the output-side conductive line 11B is adjusted by the second magnetic body portion 32 being arranged. In the disclosure herein, the part of the output-side conductive line 11B of the first conductive line 11 surrounded by the second magnetic body portion 32 is termed "second portion".

The third magnetic body portion 33 extends between the first magnetic body portion 31 and the second magnetic body portion 32 and is arranged to cover a part of a circumference of the branch portion 11c of the first conductive line 11. In this example, the third magnetic body portion 33 is in contact with both the first magnetic body portion 31 and the second magnetic body portion 32, however, it may be separated from at least one of the first magnetic body portion 31 or the second magnetic body portion 32. Further, the third magnetic body portion 33 is not limited to this example, and may employ various configurations. For example, the third magnetic body portion 33 may be a magnetic sheet that spirals around the first conductive line 11 as described later. The magnetic coupling between the input-side conductive line 11A and the output-side conductive line 11B can be adjusted by the third magnetic body portion 33 being arranged to extend between the first magnetic body portion 31 and the second magnetic body portion 32. That is, the coupling coefficient k between the input-side conductive line 11A and the output-side conductive line 11B can be adjusted by the third magnetic body portion 33.

In this noise filter 10, a mutual inductance between the input-side conductive line 11A and the output-side conductive line 11B is adjustable by adjusting materials and configurations of the first magnetic body portion 31, the second magnetic body portion 32, and the third magnetic body portion 33. Thus, a sum of an equivalent series inductance of the capacitor 20 and a parasitic inductance of the second conductive line 12 is reduced by the mutual inductance. As a result, as indicated by the above formula 2, the noise filter 10 can exhibit high filtering performance for electromagnetic noise in high-frequency band. The mutual inductance between the input-side conductive line 11A and the output-side conductive line 11B may not necessarily be equal to the sum of the equivalent series inductance of the capacitor 20 and the parasitic inductance of the second conductive line 12. The filtering performance of the noise filter 10 can be improved by adjusting M to satisfy $|L_3-M|<L_3$, where "M" is the mutual inductance and "$L_3$" is the sum of the equivalent series inductance of the capacitor 20 and the parasitic inductance of the second conductive line 12.

In the noise filter 10, the sum of the equivalent series inductance of the capacitor 20 and the parasitic inductance of the second conductive line 12 is reduced simply by arranging the first magnetic body 30 around the circumference of the first conductive line 11. In this example, the first conductive line 11 is a bus bar, however, the same applies even if it is a conductive line of another type. Further, regardless of the shape of the first conductive line 11, the sum of the equivalent series inductance of the capacitor 20 and the parasitic inductance of the second conductive line 12 can be reduced by arranging the first magnetic body 30 around the circumference of the first conductive line 11. Especially, the first magnetic body 30 configured of a magnetic sheet can easily be arranged to the first conductive line 11. The art of arranging the first magnetic body 30 around the circumference of the first conductive line 11 can be said as being highly versatile since it can be applied to various types of conductive lines.

Instead of the art disclosed herein, disposing a coil on each of the input-side conductive line and the output-side conductive line might be considered. However, magnetic coupling between general coils, which do not have magnetic cores, is weak, and in order to make it stronger, arrangement of conductive line paths and coil shapes need to be modified. This may lead to a lower degree of freedom in the arrangement of the conductive line paths and an increase in coil weight, and these may cause an increase in size of noise filter circuit structure. Therefore, the technique of disposing the coil on each of the input-side conductive line and the output-side conductive line can be said as being low versatile. Further, use of coils having iron cores makes the adjustment of the mutual inductance more difficult, as a result of which an additional coil needs to be disposed in series to the capacitor for the adjustment of the mutual inductance. This may lead to increases in the number of components, cost, and size, since there is no essential need to dispose such a coil in series to a capacitor in a noise filter circuit. To the contrary, the art disclosed herein does not use any coil, thus it can avoid the aforementioned problems.

Figure 4A:
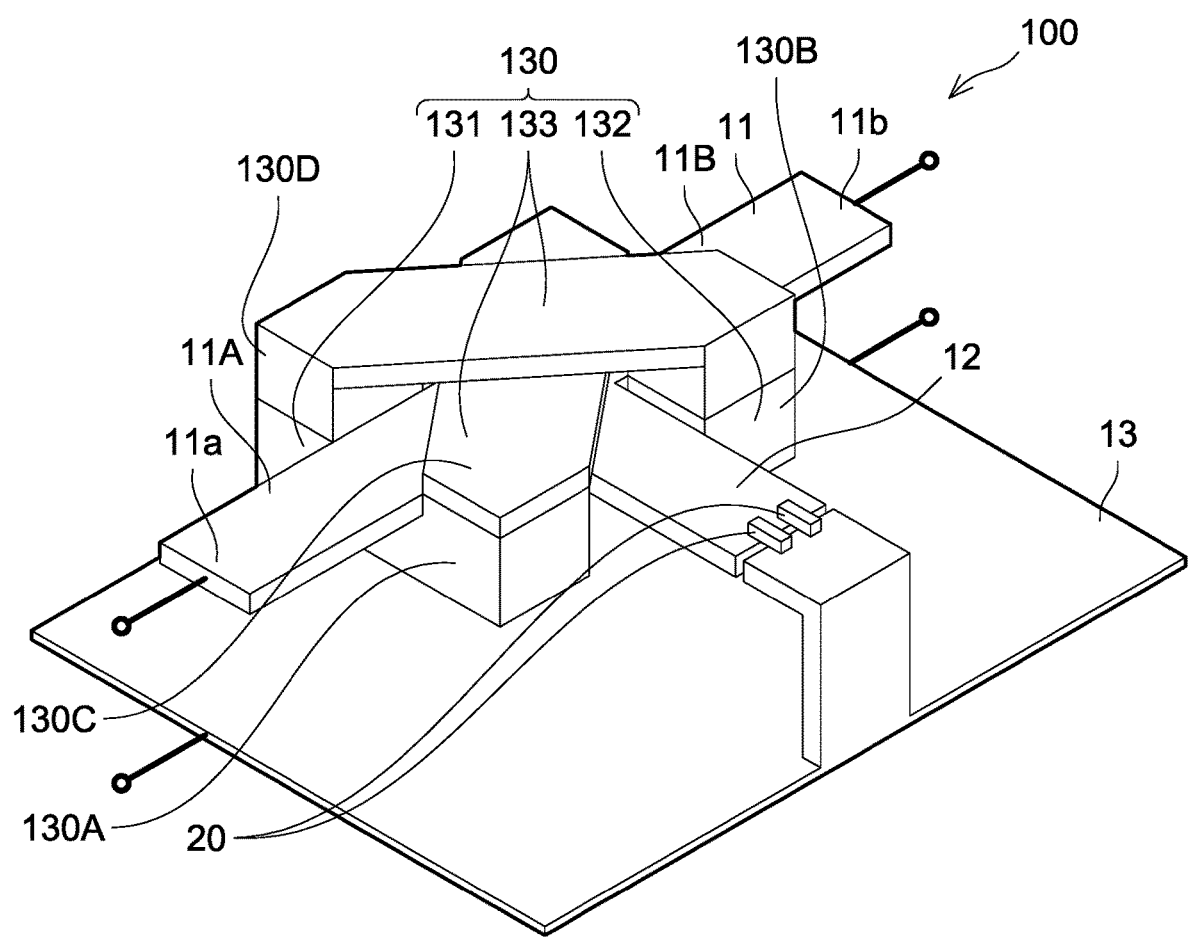
FIG. 4A schematically shows a perspective view of another noise filter of the present embodiment.
Figure 4B:
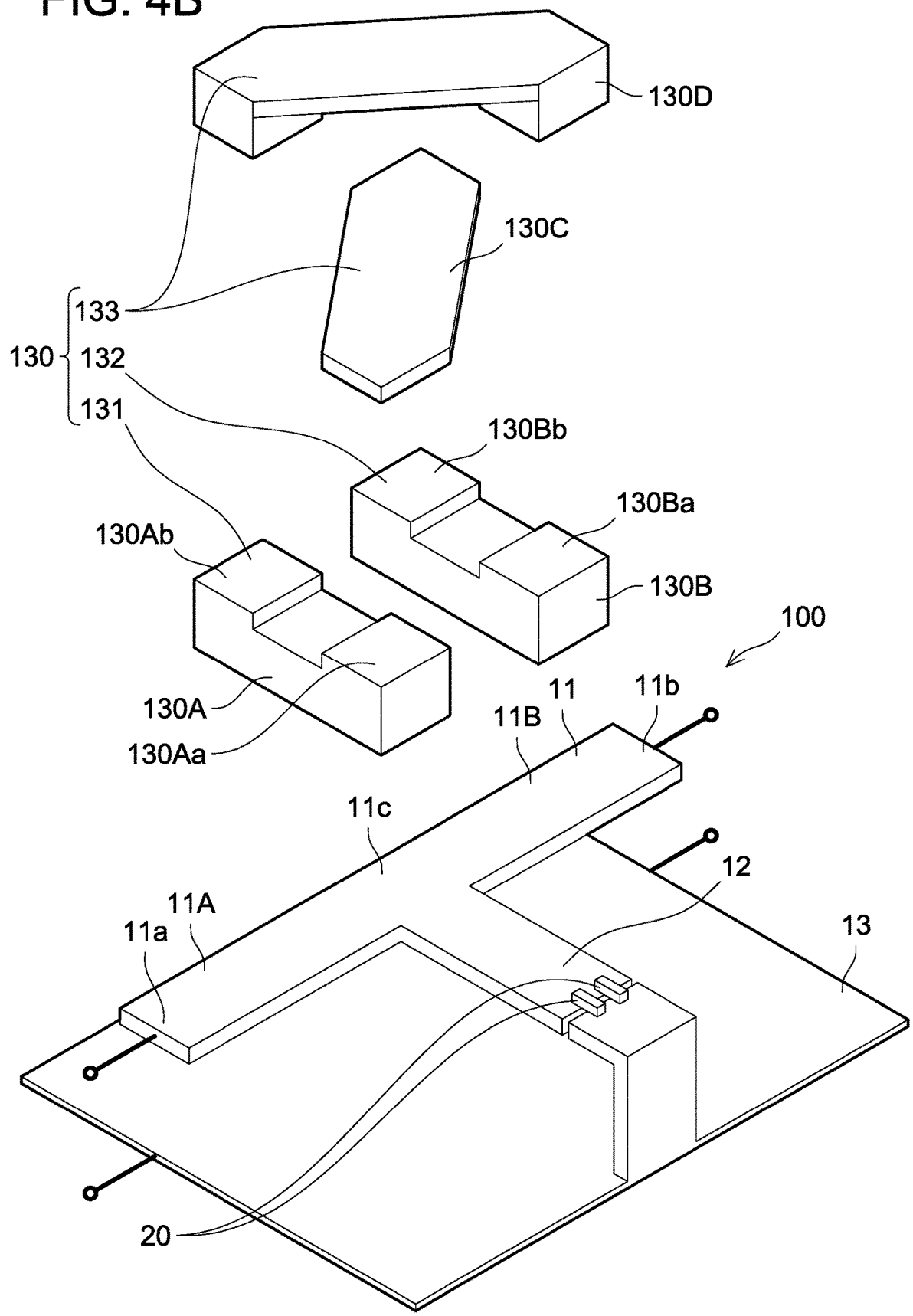
FIG. 4B schematically shows an exploded perspective view of the other noise filter of the present embodiment.

Hereinbelow, another noise filter to which the art disclosed herein is applied will be described. FIG. 4A shows a perspective view of a noise filter 100, and FIG. 4B shows an exploded perspective view thereof. In the noise filter 100, a first magnetic body 130 is configured of a combination of a first lower divided portion 130A, a second lower divided portion 130B, a first upper divided portion 130C, and a second upper divided portion 130D. A first magnetic body portion 131, a second magnetic body portion 132, and a third magnetic body portion 133 of the first magnetic body 130 are configured by combining these divided portions 130A, 130B, 130C, 130D.

Each of these divided portions 130A, 130B, 130C, and 130D is a magnetic plate obtained by shaping ferrite and/or the like resulting from sintering of a material such as Mn—Zn or Ni—Zn. The first lower divided portion 130A and the second lower divided portion 130B have a common configuration.

The first lower divided portion 130A extends below the input-side conductive line 11A to cross the input-side conductive line 11A along a short direction thereof. The first lower divided portion 130A has a U shape and surrounds a part of the circumference of the input-side conductive line 11A. Top surfaces of a first end 130Aa and a second end 130Ab of the first lower divided portion 130A are located above an upper surface of the first conductive line 11.

The second lower divided portion 130B extends below the output-side conductive line 11B to cross the output-side conductive line 11B along a short direction thereof. The second lower divided portion 130B has a U shape and surrounds a part of the circumference of the output-side conductive line 11B. Top surfaces of a first end 130Ba and a second end 130Bb of the second lower divided portion 130B are located above the upper surface of the first conductive line 11.

The first upper divided portion 130C crosses the first conductive line 11 above the branch portion 11c of the first conductive line 11 and extends between the first end 130Aa of the first lower divided portion 130A and the second end 130Bb of the second lower divided portion 130B. One end of the first upper divided portion 130C is connected to the first end 130Aa of the first lower divided portion 130A, and another end thereof is connected to the second end 130Bb of the second lower divided portion 130B. As needed, between the first upper divided portion 130C and the first end 130Aa of the first lower divided portion 130A and/or the second end 130Bb of the second lower divided portion 130B, gap(s) may be provided. The mutual inductance between the input-side conductive line 11A and the output-side conductive line 11B can be adjusted by adjusting the gap distance(s).

The second upper divided portion 130D crosses the first conductive line 11 above the branch portion 11c of the first conductive line 11 and extends between the second end 130Ab of the first lower divided portion 130A and the first end 130Ba of the second lower divided portion 130B. One end of the second upper divided portion 130D is connected to the second end 130Ab of the first lower divided portion 130A, and another end thereof is connected to the first end 130Ba of the second lower divided portion 130B. As needed, between the second upper divided portion 130D and the second end 130Ab of the first lower divided portion 130A and/or the first end 130Ba of the second lower divided portion 1308, gap(s) may be provided. The mutual inductance between the input-side conductive line 11A and the output-side conductive line 11B can be adjusted by adjusting the gap distance(s).

The first lower divided portion 130A and the second lower divided portion 130B are arranged parallel to each other and along the short direction of the first conductive line 11. The first upper divided portion 130C and the second upper divided portion 130D are arranged to be skew above the branch portion 11c. With this first magnetic body 130, assuming that a current flowing from an input side to an output side is a positive current, a magnetic flux from the input-side conductive line 11A and a magnetic flux from the output-side conductive line 11B enhance each other, thus the input-side conductive line 11A and the output-side conductive line 11B can be magnetically coupled such that a sign of the mutual inductance between the input-side conductive line 11A and the output-side conductive line 11B is positive.

In the noise filter 100 as well, the input-side conductive line 11A and the output-side conductive line 11B are magnetically coupled by arranging the first magnetic body 130 around the circumference of the first conductive line 11, and the equivalent series inductance of the capacitor 20 and the parasitic inductance of the second conductive line 12 can be reduced by the mutual inductance therebetween.

Figure 5:
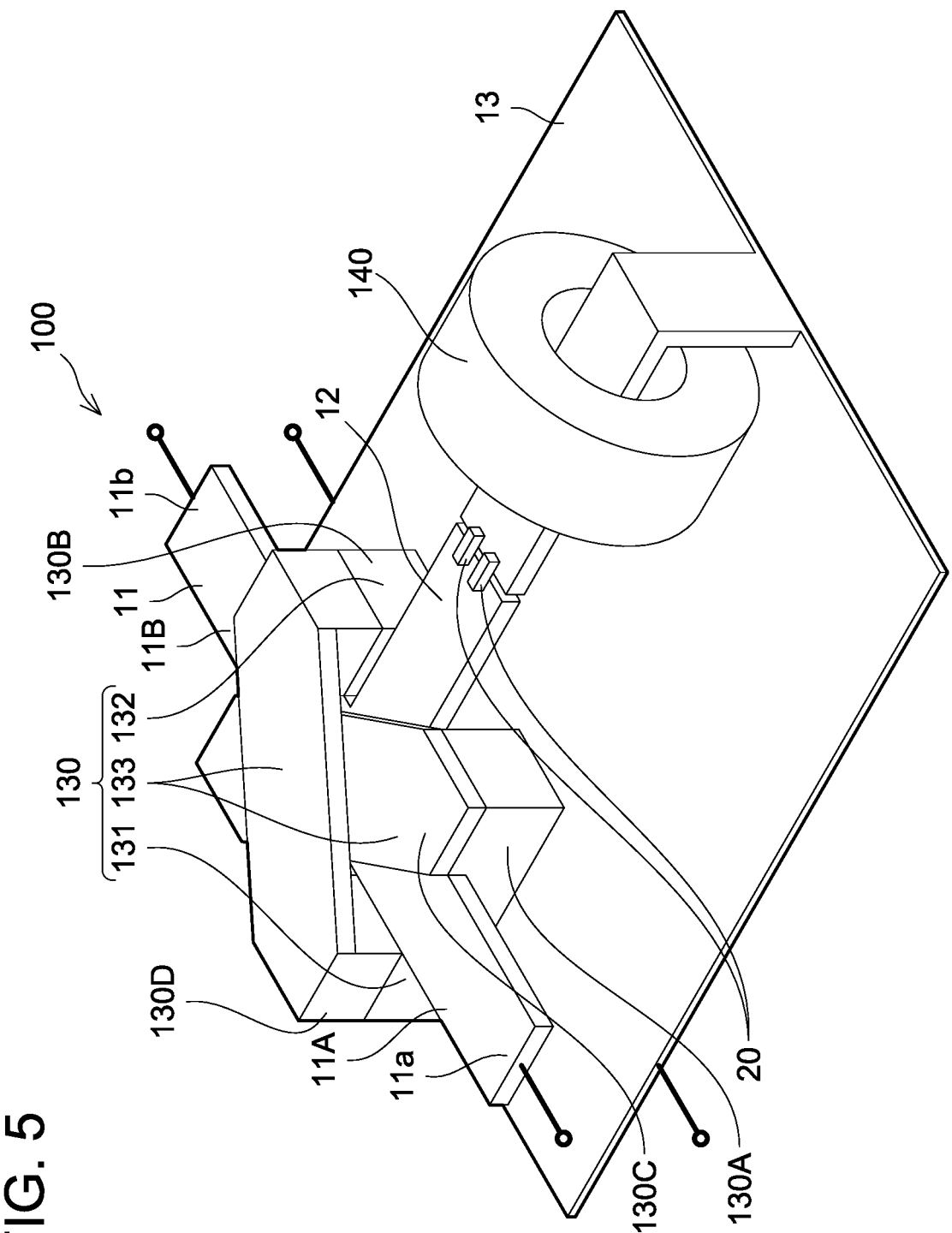
FIG. 5 schematically shows a perspective view of a noise filter that is a variant of the noise filter of FIGS. 4A and 4B.

FIG. 5 shows a variant of the noise filter 100 shown in FIGS. 4A and 4B. This noise filter 100 is characterized in including a second magnetic body 140 arranged to surround a circumference of a part of the second conductive line 12 between the branch portion 11c of the first conductive line 11 and the ground plate 13. The second magnetic body 140 is a ring-shaped ferrite core obtained by shaping ferrite and/or the like resulting from sintering of a material such as Mn—Zn or Ni—Zn. In this example, the second magnetic body 140 is arranged to circumferentially surround the entire circumference of the part of the second conductive line 12, however, it may be arranged to circumferentially surround a part of the circumference. Further, the second magnetic body 140 is not limited to this example, and may employ various configurations. For example, the second magnetic body 140 may be a magnetic sheet that spirals around the second conductive line 12.

Here, as already described in connection with the above formulas 1 and 2, the basic characteristic of the noise filter 100 is that improvement of the filtering performance is realized by reducing the equivalent series inductance of the capacitor 20 and the parasitic inductance of the second conductive line 12 using the mutual inductance (M) generated between the input-side conductive line 11A and the output-side conductive line 11B by the first magnetic body 130. In doing so, the mutual inductance (M) is added to each of the inductance (L1+M) of the input-side conductive line 11A and the inductance (L2+M) of the output-side conductive line 11B. Thus, the denominator of the above formula 1 becomes larger due to the increase in the inductances (L1+M, L2+M) of the conductive lines 11A and 11B, and strictly speaking, an auxiliary effect of improving the filtering performance by the increase in these inductances is also achieved.

In the noise filter 100 of the variant of FIG. 5, the inductance of the second conductive line 12 is increased by the second magnetic body 140. To cancel this increase in the inductance of the second conductive line 12, the mutual inductance between the input-side conductive line 11A and the output-side conductive line 11B can be increased by the first magnetic body 130.

For example, the mutual inductance can be increased based on the magnetic material and configuration of the first magnetic body 130. As above, in the noise filter 100, each of the inductance (L1+M) of the input-side conductive line 11A and the inductance (L2+M) of the output-side conductive line 11B can further be increased due to the second magnetic body 140, as a result of which the denominator of the above formula 1 becomes even larger, and thus the filtering performance can further be improved.

Further, the noise filter 100 of the variant of FIG. 5 has an additional characteristic as described below. To understand the additional characteristic of the noise filter 100 of the variant of FIG. 5, the above formulas 1 to 3 will further be considered.

Since the impedance of the inductance of the branch line and the impedance of the capacitor are large as compared to a conductor loss, only imaginary parts of these impedances were considered in derivation of the above formulas 1 and 2. However, when the frequency is high and/or resonates, the influence of the conductor loss and loss components of magnetic bodies to be described later is large, thus it is desirable to take the conductor loss and the loss components of magnetic bodies into consideration. Taking real parts of the impedances into consideration, the above formula 2 can be rewritten as follows.

$$V_{Lnum} = \left[R + j\left\{\omega(L_3 - M) - \frac{1}{\omega C}\right\}\right] Z_2 V_{noise} \qquad \text{[Formula 4]}$$

Here, R is a total loss component of the conductor loss of the branch line and the loss of the capacitor. Further, taking the loss component of the magnetic bodies, that is, a complex component of magnetic permeability into consideration, the above formula 3 can be rewritten as follows.

$$M = k\frac{\mu_0 \mu_{r1} S}{l} - jk\frac{\mu_0 \mu_{r2} S}{l} \quad \text{[Formula 5]}$$

$\mu_0$: magnetic permeability in vacuum $\mu_{r1}$: real part of relative magnetic permeability of the first magnetic body $\mu_{r2}$: imaginary part of the relative magnetic permeability of the first magnetic body S: cross-sectional area of a magnetic path of the first magnetic body l: average magnetic path length of the first magnetic body The following formula is derived by substituting the above formula 5 to the above formula 4.

$$V_{Lnum} = \left[R - k\omega\frac{\mu_0 \mu_{r2} S}{l} + j\left\{\omega\left(L_3 - k\frac{\mu_0 \mu_{r1} S}{l}\right) - \frac{1}{\omega C}\right\}\right] Z_2 V_{noise} \quad \text{[Formula 6]}$$

Since the angular frequency ω is included in the negative item of the real part of the formula 6, the real part of the above formula 6 has a frequency characteristic. Due to this, it can be understood that the real part of the above formula 6 affects the filtering performance. That is, strictly considering, it can be understood that the conductor loss and the loss components of the magnetic bodies affect the filtering performance.

As such, to improve the filtering performance, it is desirable to adjust the loss component R such that the real part of the above formula 6 becomes smaller. For example, the real part of the above formula 6 may be made smaller by adjusting the loss component R by a wiring pattern of the branch line, or the real part of the above formula 6 may be made smaller by adjusting the loss component R by connecting a resistor (such as a chip resistor) to the branch line to be in series connection with the capacitor. Such art of adjusting the loss component R is useful in that the real part of the above formula 6 is made smaller and the filtering performance is improved. However, as it is apparent from the above formula 6, if the loss component R does not have the frequency characteristic, the real part of the above formula 6 becomes smaller only at a specific frequency and thus only a limited improvement is achieved for the filtering performance.

In the noise filter 100 of the variant of FIG. 5, the second magnetic body 140 is disposed on the second conductive line 12. Due to this, in the noise filter 100 of the variant of FIG. 5, the loss component of the second magnetic body 140 is added to the loss component R, by which the loss component R can have the frequency characteristic. Further, the second magnetic body 140 and the first magnetic body 130 are constituted of the same magnetic material, that is, they have the same magnetic permeability. Therefore, in the noise filter 100 of the variant of FIG. 5, each of the loss components of positive and negative items in the real part of the above formula 6 increases proportional to the frequency, thus these loss components are cancelled without depending on frequency change. As such, the noise filter 100 of the variant of FIG. 5 can exhibit high filtering performance.

As above, the art of disposing the second magnetic body 140 on the second conductive line 12 contributes to the improvement of the filtering performance based on more strict design, in addition to the improvement of the filtering performance achieved by increasing each of the inductance (L1+M) of the input-side conductive line 11A and the inductance (L2+M) of the output-side conductive line 11B. The art of disposing the second magnetic body 140 on the second conductive line 12 can be also applied similarly to noise filters of other embodiments disclosed herein.

Figure 6A:
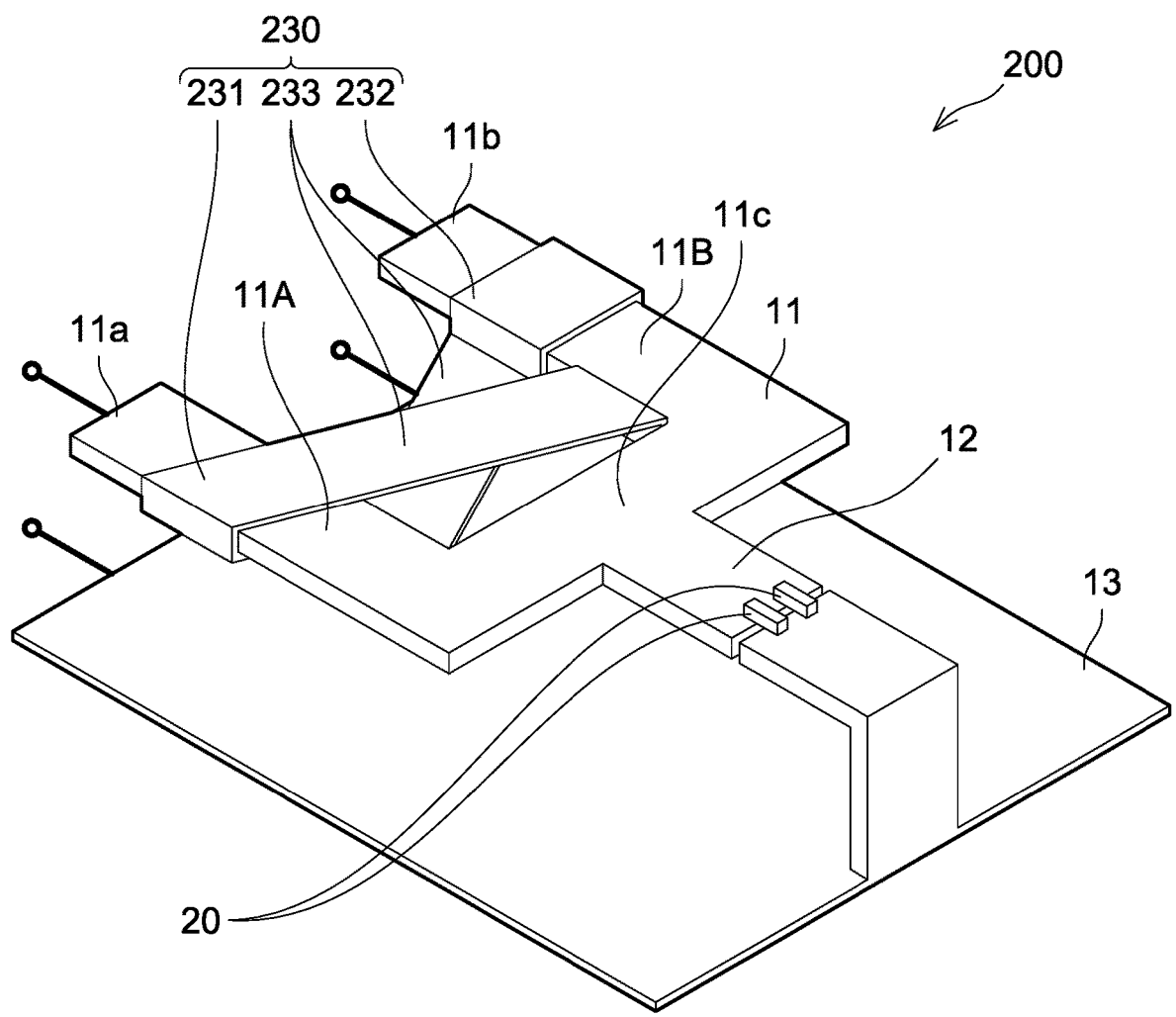
FIG. 6A schematically shows a perspective view of another noise filter of the present embodiment.
Figure 6B:
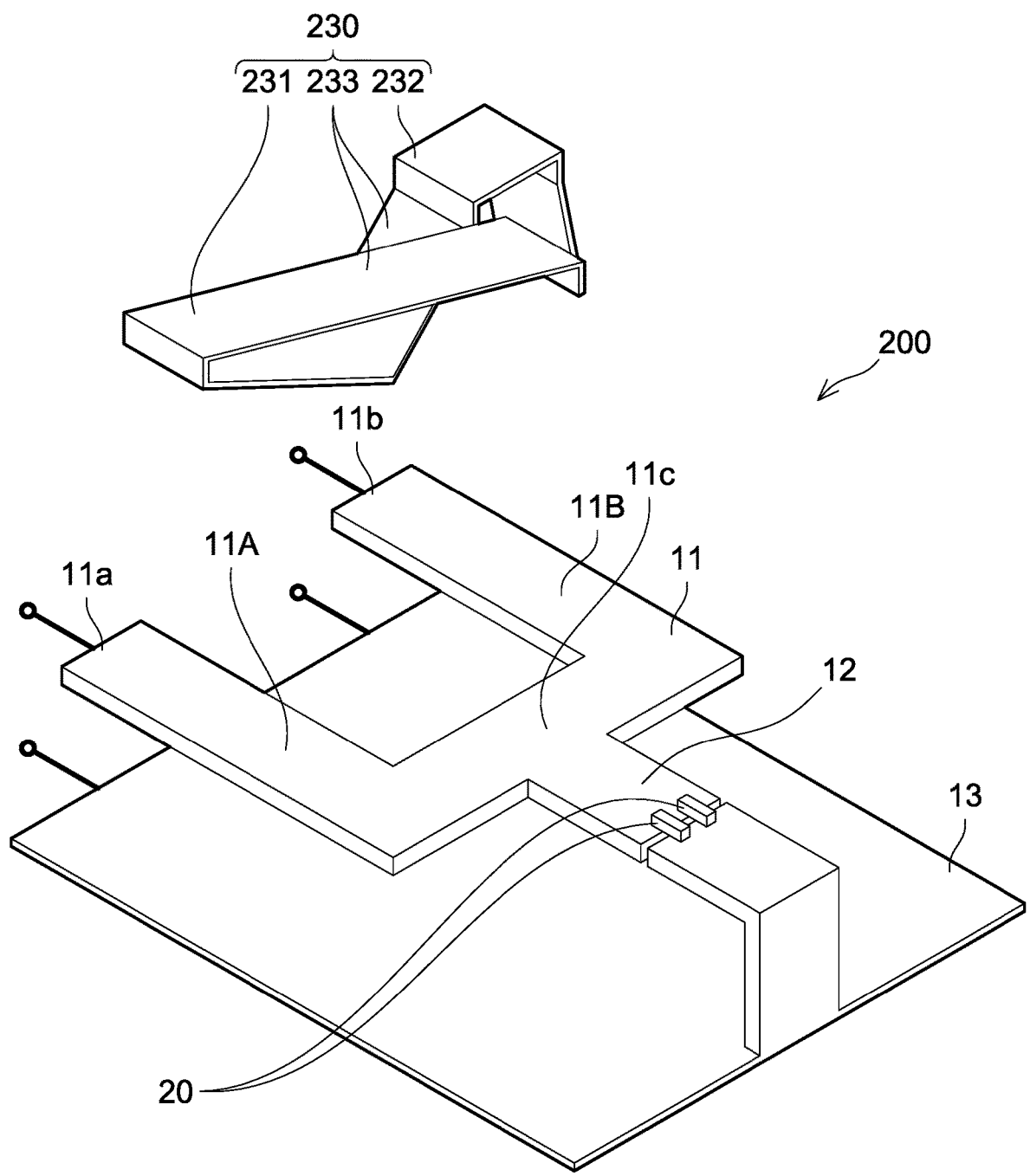
FIG. 6B schematically shows an exploded perspective view of the other noise filter of the present embodiment.

FIG. 6A shows a perspective view of a noise filter 200, and FIG. 6B shows an exploded perspective view thereof. In the noise filter 200, the input-side conductive line 11A and the output-side conductive line 11B face each other with an interval of a predetermined distance therebetween and extend parallel to each other.

A first magnetic body 230 is configured of a magnetic sheet. The first magnetic body 230 includes a first magnetic body portion 231 arranged to cover a circumference of a part of the input-side conductive line 11A, a second magnetic body portion 232 arranged to cover a circumference of a part of the output-side conductive line 11B, and a pair of third magnetic body portions 233 extending between the first magnetic body portion 231 and the second magnetic body portion 232. The first magnetic body 230 is arranged to loop outside a part of the input-side conductive line 11A and apart of the output-side conductive line 11B. The pair of third magnetic body portions 233 extend to be skew with respect to each other. With this first magnetic body 230, assuming that a current flowing from the input side to the output side is a positive current, a magnetic flux from the input-side conductive line 11A and a magnetic flux from the output-side conductive line 11B enhance each other, as a result of which the input-side conductive line 11A and the output-side conductive line 11B can be magnetically coupled such that the sign of the mutual inductance between the input-side conductive line 11A and the output-side conductive line 11B is positive.

In the noise filter 200 as well, the input-side conductive line 11A and the output-side conductive line 11B are magnetically coupled by arranging the first magnetic body 230 around the circumference of the first conductive line 11, and the equivalent series inductance of the capacitor 20 and the parasitic inductance of the second conductive line 12 can be reduced by the mutual inductance therebetween.

Figure 7A:
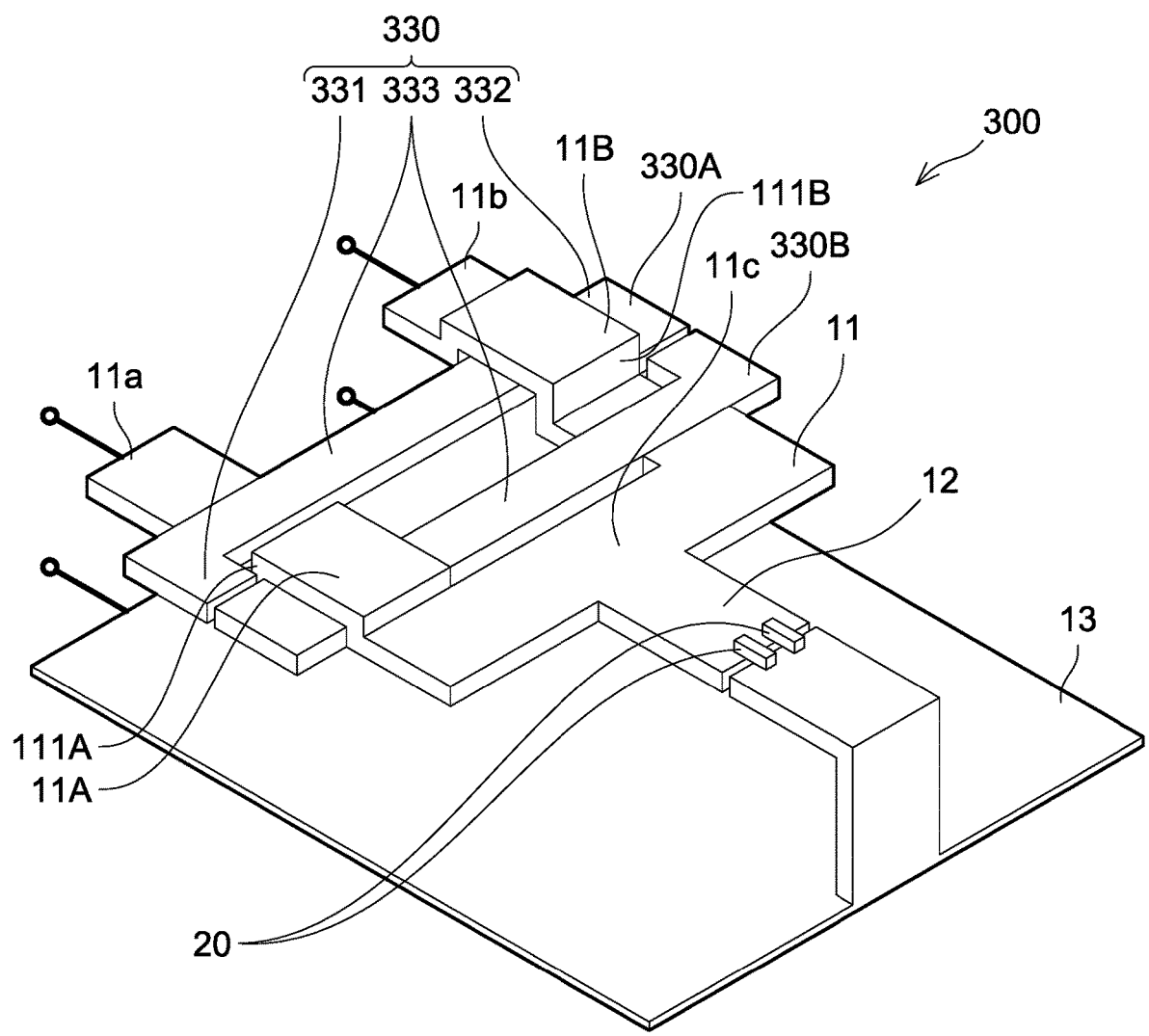
FIG. 7A schematically shows a perspective view of another noise filter of the present embodiment.
Figure 7B:
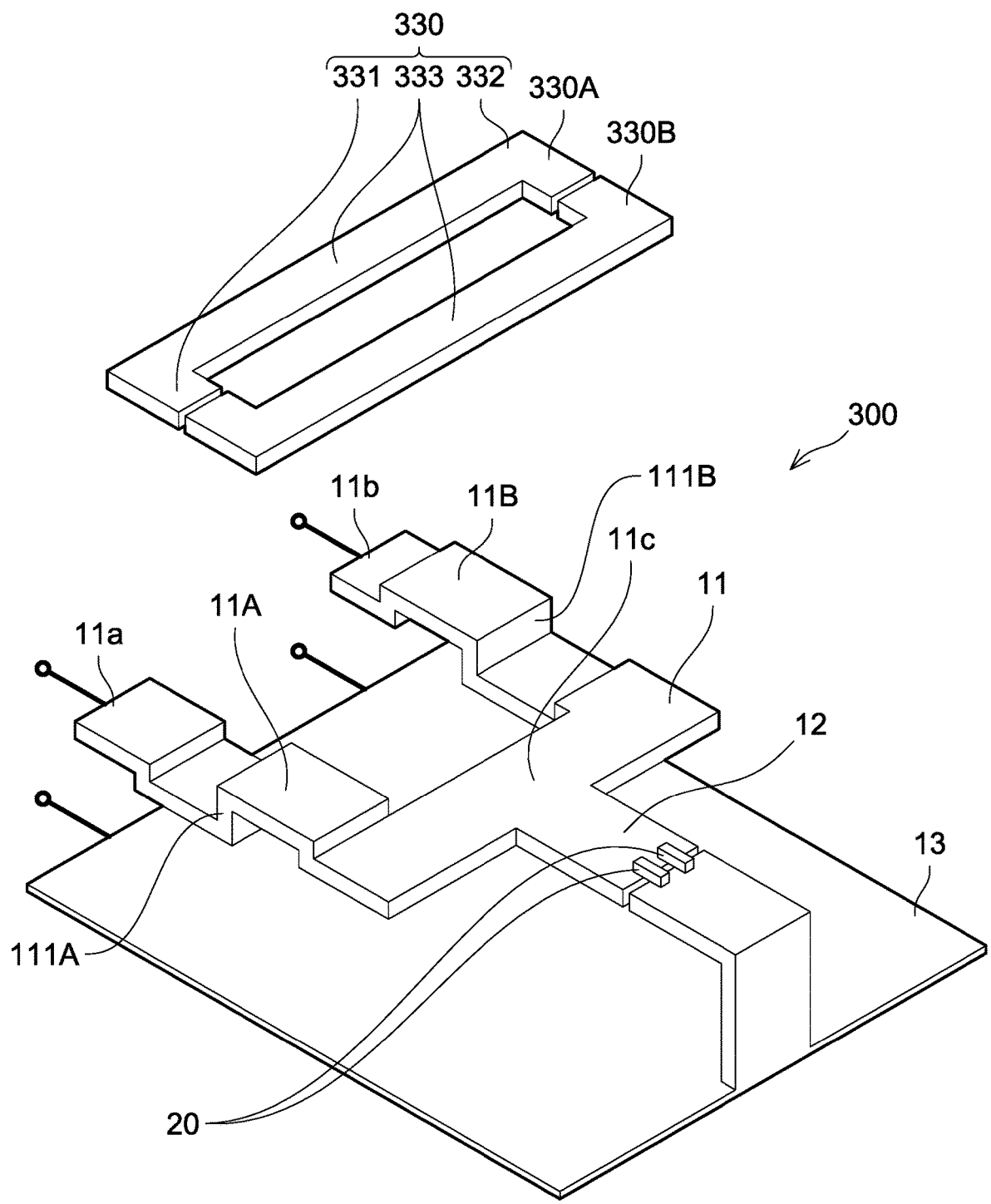
FIG. 7B schematically shows an exploded perspective view of the other noise filter of the present embodiment.

FIG. 7A shows a perspective view of a noise filter 300, and FIG. 7B shows an exploded perspective view thereof. In the noise filter 300, a first magnetic body 330 is configured of a combination of a first divided portion 330A and a second divided portion 330B. A first magnetic body portion 331, a second magnetic body portion 332, and a third magnetic body portion 333 of the first magnetic body 330 are configured by combining the first divided portion 330A and second divided portion 330B.

Each of the first divided portion 330A and the second divided portion 330B is a magnetic plate obtained by shaping ferrite and/or the like resulting from sintering of a material such as Mn—Zn or Ni—Zn, and has a U shape. The first divided portion 330A and the second divided portion 330B have a common configuration. Each of the input-side conductive line 11A and the output-side conductive line 11B has a configuration that bends in either one of up direction or down direction of up-down directions perpendicular to a longitudinal direction (the up and down directions can be also directions perpendicular to a surface of the bus bar) and then bends back in the other of the up direction and the down direction. The first divided portion 330A and the second divided portion 330B are arranged in spaces defined between the bends. A gap is provided between one end of the first divided portion 330A and one end of the second divided portion 330B, and another gap is provided between another end of the first divided portion 330A and another end of the second divided portion 330B. The mutual inductance between the input-side conductive line 11A and the output-side conductive line 11B can be adjusted by adjusting the gap distances. Although the gaps are provided corresponding respectively to the first magnetic body portion 331 and the second magnetic body portion 332, instead of this example, a gap may be provided in the third magnetic body portion 333. Further, instead of the gap(s), width(s) of part(s) of the magnetic body portion(s) may be narrow.

A portion 111A of the input-side conductive line 11A that is surrounded by the first magnetic body portion 331 extends in the up-down directions perpendicular to the longitudinal direction of the input-side conductive line 11A. A portion 111B of the output-side conductive line JIB that is surrounded by the second magnetic body portion 332 also extends in the up-down directions perpendicular to the longitudinal direction of the output-side conductive line 11B. With this first magnetic body 330, assuming that a current flowing from the input side to the output side is a positive current, a magnetic flux from the input-side conductive line 11A and a magnetic flux from the output-side conductive line 11B enhance each other, as a result of which the input-side conductive line 11A and the output-side conductive line 11B can be magnetically coupled such that the sign of the mutual inductance between the input-side conductive line 11A and the output-side conductive line 11B is positive.

In the noise filter 300 as well, the input-side conductive line 11A and the output-side conductive line 11B are magnetically coupled by arranging the first magnetic body 330 around the circumference of the first conductive line 11, and the equivalent series inductance of the capacitor 20 and the parasitic inductance of the second conductive line 12 can be reduced by the mutual inductance therebetween.

First Embodiment

Results of study on the filtering performances of noise filters to which the art disclosed herein is applied will be described with reference to FIGS. 8A to 8C and 9A to 9C.

Figure 8A:
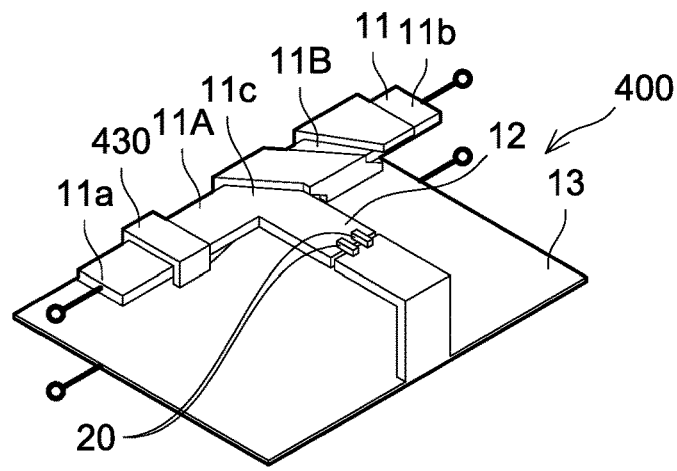
FIG. 8A schematically shows a perspective view of the noise filter of the present embodiment.

FIG. 8A shows a noise filter 400 to which the art disclosed herein is applied. A first magnetic body 430 is configured of a magnetic sheet and spirals around the first conductive line 11. In this example, the first magnetic body 430 is arranged clockwise from a part of the input-side conductive line 11A to a part of the output-side conductive line 11B via the branch portion 11c in a direction from the input terminal portion 11a toward the output terminal portion 11b. In this noise filter 400, the input-side conductive line 11A and the output-side conductive line 11B are magnetically coupled by the first magnetic body 430, and the equivalent series inductance of the capacitor 20 and the parasitic inductance of the second conductive line 12 are reduced by the mutual inductance therebetween.

Figure 8B:
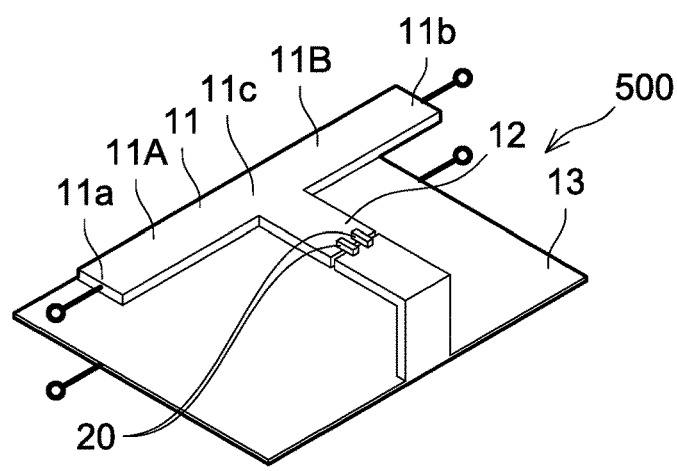
FIG. 8B schematically shows a perspective view of a noise filter of a variant.
Figure 9A:
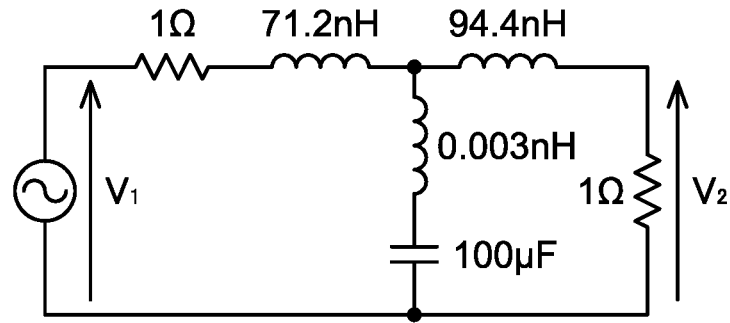
FIG. 9A is a diagram of an equivalent circuit of the noise filter of FIG. 8A.

FIG. 9A is an equivalent circuit diagram of the noise filter 400 of FIG. 8A. An internal impedance of the noise source is 1Ω, an impedance of the load circuit is 1Ω, and a static capacitance of the capacitor is 100 μF. The inductance of the input-side conductive line 11A is 71.2 nH, the inductance of the output-side conductive line 11B is 94.4 nH, and a sum of the equivalent series inductance of the capacitor 20 and the parasitic inductance of the second conductive line 12 is 0.003 nH. In the noise filter 400, the sum of the equivalent series inductance of the capacitor 20 and the parasitic inductance of the second conductive line 12 is significantly small because the equivalent series inductance of the capacitor 20 and the parasitic inductance of the second conductive line 12 are reduced by the mutual inductance between the input-side conductive line 11A and the output-side conductive line 11B. Further, as compared to an example of FIG. 8B to be described later, each of the inductance of the input-side conductive line 11A and the inductance of the output-side conductive line 11B is increased not only by the increase in the self-inductance achieved by the first magnetic body 430 but also by the mutual inductance.

FIG. 8B shows a noise filter 500 of a comparative example. In this noise filter 500, no magnetic body is arranged around the circumference of the first conductive line 11.

Figure 9B:
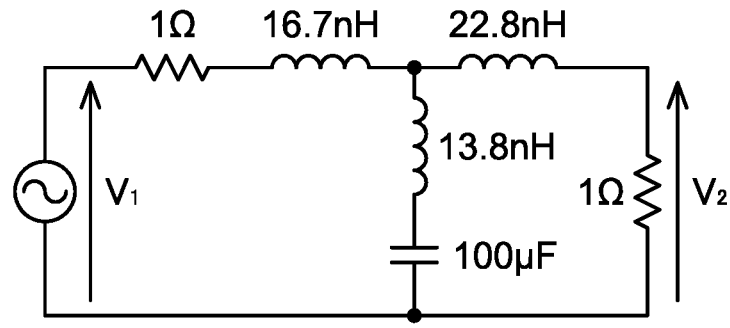
FIG. 9B is a diagram of an equivalent circuit of the noise filter of FIG. 8B.

FIG. 9B is an equivalent circuit diagram of the noise filter 500 of FIG. 8B. Since no magnetic body is arranged in the noise filter 500, each of the input-side conductive line 11A and the output-side conductive line 11B has only the parasitic inductance of the line, thus they exhibit values that are smaller as compared to cases where a magnetic body is arranged. Further, the magnetic coupling of the input-side conductive line 11A and the output-side conductive line 11B is so small that it does not influence the parasitic inductance of the conductive line. Therefore, the sum of the equivalent series inductance of the capacitor 20 and the parasitic inductance of the second conductive line 12 is maintained at a high value.

Figure 8C:
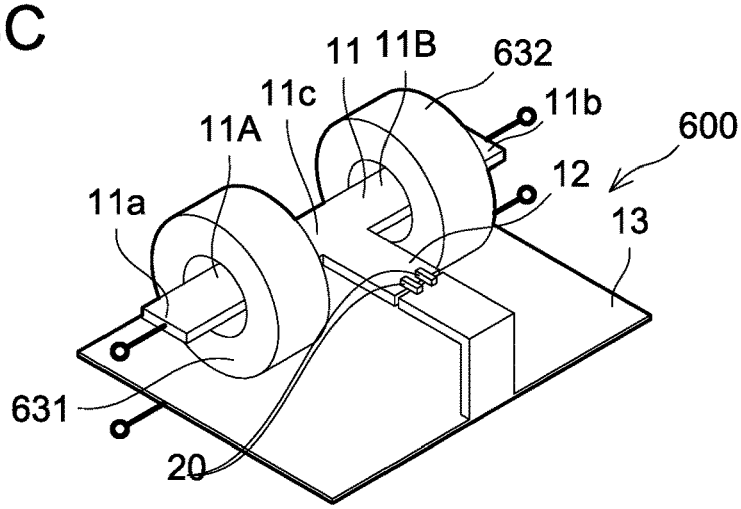
FIG. 8C schematically shows a perspective view of a noise filter of a variant.

FIG. 8C shows a noise filter 600 of a comparative example. In this noise filter 600, an input-side magnetic body 631, which is a ring-shaped ferrite core, is disposed on the input-side conductive line 11A, and an output-side magnetic body 632, which is a ring-shaped ferrite core, is also disposed on the output-side conductive line 11B.

Figure 9C:
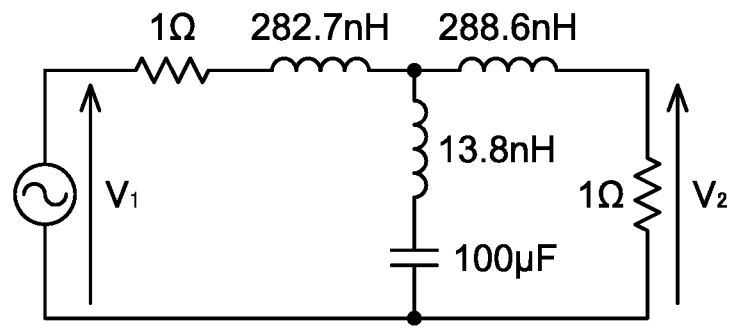
FIG. 9C is a diagram of an equivalent circuit of the noise filter of FIG. 8C.

FIG. 9C shows an equivalent circuit diagram of the noise filter 600 of FIG. 8C. Since the input-side magnetic body 631 and the output-side magnetic body 632 are arranged in the noise filter 600, the inductance of the input-side conductive line 11A and the inductance of the output-side conductive line 11B are increased significantly. Meanwhile, the input-side conductive line 11A and the output-side conductive line 11B are not magnetically coupled because the input-side magnetic body 631 and the output-side magnetic body 632 are arranged apart from each other. Therefore, the sum of the equivalent series inductance of the capacitor 20 and the parasitic inductance of the second conductive line 12 is maintained at a high value.

Figure 10:
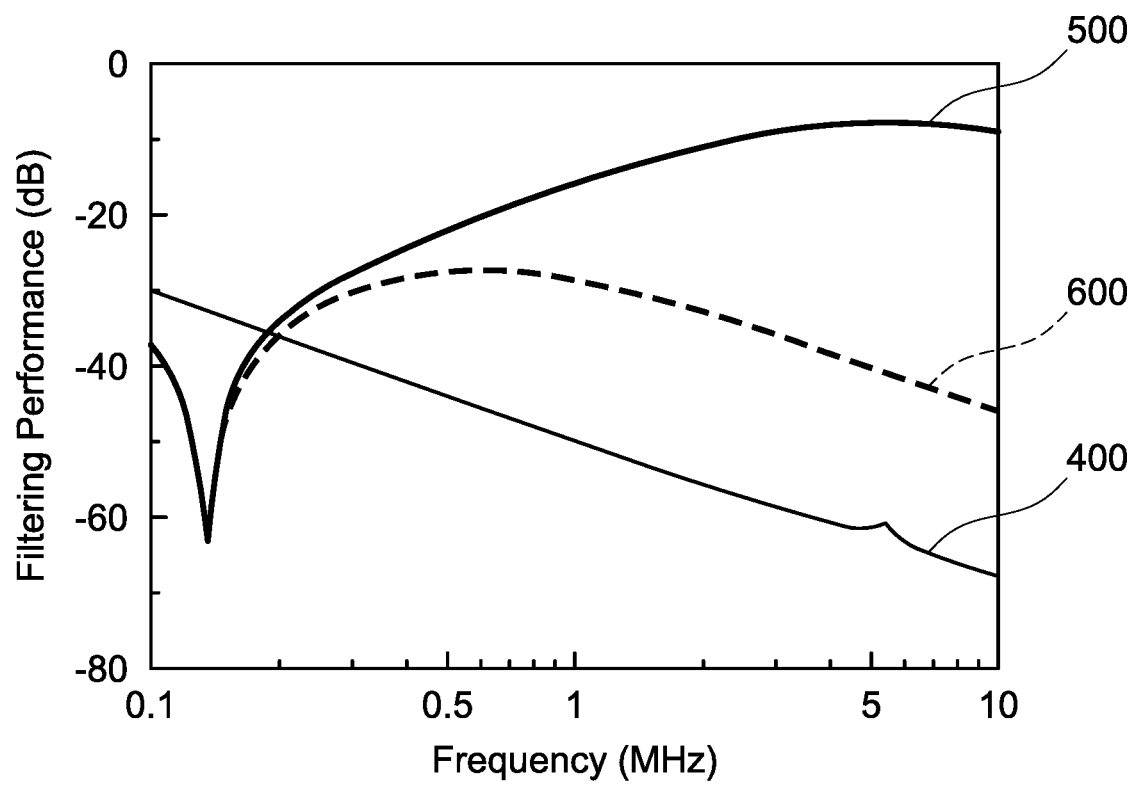
FIG. 10 shows filtering performances of the noise filters of FIGS. 8A to 8C.

FIG. 10 shows results of the filtering performances of the noise filters 400, 500, 600 of FIGS. 8A to 8C. The filtering performances were calculated by $20 \times \log_{10}(V_2/V_1)$ (dB).

As shown in FIG. 10, the filtering performance for electromagnetic noise in high-frequency band is degraded in the noise filter 500 of the comparative example in which no magnetic body is arranged (FIG. 8B). On the other hand, the filtering performance for electromagnetic noise in high-frequency band is significantly improved in the noise filter 400 of the present embodiment (FIG. 8A). The filtering performance for electromagnetic noise in high-frequency band is improved in the noise filter 600 of the comparative example in which the magnetic bodies 631, 632, which are the ring-shaped ferrite cores, are disposed (FIG. 8C) due to the increase in the inductances of the input-side conductive line 11A and the output-side conductive line 11B, however, it is inferior to the filtering performance of the noise filter 400 of the present embodiment. As above, it has been confirmed that, to improve the filtering performance of the noise filter, it is important to reduce at least the equivalent series inductance of the capacitor 20 and the parasitic inductance of the second conductive line 12, as in the noise filter 400 of the present embodiment (FIG. 8A).

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

The invention claimed is:

1. A noise filter comprising:
   a first conductive line extending between an input terminal portion and an output terminal portion, the first conductive line including:
      an input-side conductive line extending between the input terminal portion and a branch portion; and
      an output-side conductive line extending between the output terminal portion and the branch portion;
   a second conductive line connected to the branch portion of the first conductive line, wherein a capacitor is on the second conductive line; and
   a first magnetic body surrounding at least a part of a circumference of at least a part of the first conductive line, the first magnetic body being configured to magnetically couple the input-side conductive line to the output-side conductive line such that at least an equivalent series inductance of the capacitor and a parasitic inductance of the second conductive line are reduced by a mutual inductance between the input-side conductive line and the output-side conductive line, the first magnetic body comprising:
      a first magnetic body portion surrounding at least a part of a circumference of a first portion that is at least a part of the input-side conductive line;
      a second magnetic body portion surrounding at least a part of a circumference of a second portion that is at least a part of the output-side conductive line; and
      a third magnetic body portion extending between the first magnetic body portion and the second magnetic body portion, the third magnetic body portion being configured to adjust a coupling coefficient between the input-side conductive line and the output-side conductive line.

2. The noise filter according to claim 1, wherein,
   the first portion of the input-side conductive line does not include a coil, and
   the second portion of the output-side conductive line does not include a coil.

3. The noise filter according to claim 1, wherein
   the first portion of the input-side conductive line and the second portion of the output-side conductive line extend to be linearly aligned, and
   the first magnetic body is arranged to cross the first conductive line above the branch portion and surround the at least a part of the circumference of the first portion and the at least a part of the circumference of the second portion.

4. The noise filter according to claim 3, wherein
   the first magnetic body is configured of a combination of a first lower divided portion, a second lower divided portion, a first upper divided portion, and a second upper divided portion,
   the first lower divided portion extends below the first portion of the input-side conductive line to cross the input-side conductive line,
   the second lower divided portion extends below the second portion of the output-side conductive line to cross the output-side conductive line,
   the first upper divided portion crosses the first conductive line above the branch portion and extends between one end of the first lower divided portion and one end of the second lower divided portion,
   the second upper divided portion crosses the first conductive line above the branch portion and extends between another end of the first lower divided portion and another end of the second lower divided portion, and
   the first upper divided portion and the second upper divided portion are skew above the branch portion.

5. The noise filter according to claim 1, wherein
   the first portion of the input-side conductive line and the second portion of the output-side conductive line face each other with an interval of a predetermined distance therebetween and extend substantially parallel with each other, and
   the first magnetic body is arranged to loop outside the first portion and the second portion.

6. The noise filter according to claim 5, wherein
   the first magnetic body is configured of a combination of a first divided portion and a second divided portion, and
   a gap is provided between at least one end of the first divided portion and at least one end of the second divided portion.

7. The noise filter according to claim 6, wherein each of the first divided portion and the second divided portion has a U-shape.

8. The noise filter according to claim 1, wherein the first magnetic body is arranged to spiral around the first conductive line.

9. The noise filter according to claim 1, wherein the first conductive line is configured of a flat plate-shaped bus bar.

10. The noise filter according to claim 1, further comprising a second magnetic body surrounding at least a part of a circumference of at least a part of the second conductive line.

11. The noise filter according to claim 10, wherein the first magnetic body and the second magnetic body are constituted of a same magnetic material.

12. The noise filter according to claim 1, further comprising a resistor disposed on the second conductive line and connected to the capacitor in series.

* * * * *